(12) United States Patent
Gomez

(10) Patent No.: US 7,737,548 B2
(45) Date of Patent: Jun. 15, 2010

(54) SEMICONDUCTOR DIE PACKAGE INCLUDING HEAT SINKS

(75) Inventor: Jocel P. Gomez, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 190 days.

(21) Appl. No.: 11/847,001

(22) Filed: Aug. 29, 2007

(65) Prior Publication Data

US 2009/0057878 A1    Mar. 5, 2009

(51) Int. Cl.
    *H01L 23/10* (2006.01)
(52) U.S. Cl. .............................. 257/706; 257/E23.087; 257/707; 257/712; 438/122
(58) Field of Classification Search .......... 257/E23.044, 257/E23.087, E23.092, E23.098, E23.124, 257/E25.016, E23.08, 678, 690, 706, 707, 257/712, 723, 717, 719, 720, 796, 667, 713; 438/122, 123, 127; 361/704, 707
See application file for complete search history.

(56) References Cited

U.S. PATENT DOCUMENTS

| | | | |
|---|---|---|---|
| 4,392,153 A * | 7/1983 | Glascock et al. ............. 257/746 |
| 5,532,512 A * | 7/1996 | Fillion et al. ................ 257/686 |
| 6,072,240 A * | 6/2000 | Kimura et al. .............. 257/735 |
| 6,329,706 B1 | 12/2001 | Nam |
| 6,380,622 B1 * | 4/2002 | Hirai et al. .................. 257/712 |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,489,678 B1 | 12/2002 | Joshi |
| 6,556,749 B2 | 4/2003 | Uetsuka et al. |
| 6,556,750 B2 | 4/2003 | Constantino et al. |
| 6,574,107 B2 | 6/2003 | Jeon et al. |
| 6,621,152 B2 | 9/2003 | Choi et al. |
| 6,627,991 B1 | 9/2003 | Joshi |
| 6,642,738 B2 | 11/2003 | Elbanhawy |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,845,012 B2 * | 1/2005 | Ohkouchi ................... 361/704 |
| 6,867,481 B2 * | 3/2005 | Joshi et al. .................. 257/666 |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,917,103 B2 * | 7/2005 | Hirano et al. ............... 257/707 |

(Continued)

*Primary Examiner*—Chris C Chu
(74) *Attorney, Agent, or Firm*—Townsend and Townsend and Crew LLP

(57) ABSTRACT

A semiconductor die package including at least two heat sinks. The semiconductor die package includes a first heat sink, a second heat sink coupled to the first heat sink, and a semiconductor die between the first heat sink and the second heat sink. The semiconductor die is electrically coupled to the first heat sink and the second heat sink. The semiconductor die may also be attached to a lead.

14 Claims, 10 Drawing Sheets

U.S. PATENT DOCUMENTS

| | | |
|---|---|---|
| 6,943,434 B2 | 9/2005 | Tangpuz et al. |
| 6,963,133 B2 * | 11/2005 | Teshima .................... 257/718 |
| 6,989,588 B2 | 1/2006 | Quinones et al. |
| 6,992,384 B2 | 1/2006 | Joshi |
| 6,992,385 B2 * | 1/2006 | Satou et al. ................ 257/735 |
| 7,009,291 B2 * | 3/2006 | Oohama .................... 257/712 |
| 7,022,548 B2 | 4/2006 | Joshi et al. |
| 7,023,077 B2 | 4/2006 | Madrid |
| 7,030,317 B1 * | 4/2006 | Oman ........................ 174/541 |
| 7,061,077 B2 | 6/2006 | Joshi |
| 7,061,080 B2 | 6/2006 | Jeun et al. |
| 7,081,666 B2 | 7/2006 | Joshi et al. |
| 7,091,603 B2 * | 8/2006 | Mamitsu et al. ............ 257/706 |
| 7,106,592 B2 * | 9/2006 | Inoue et al. ................ 361/704 |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,477 B2 * | 9/2007 | Saito et al. ................. 257/686 |
| 7,271,497 B2 | 9/2007 | Joshi et al. |
| 7,285,849 B2 | 10/2007 | Cruz et al. |
| 7,408,251 B2 * | 8/2008 | Hata et al. ................. 257/678 |
| 7,456,492 B2 * | 11/2008 | Mochida .................... 257/659 |
| 7,547,966 B2 * | 6/2009 | Funakoshi et al. .......... 257/707 |
| 7,564,124 B2 * | 7/2009 | Lee et al. ................... 257/675 |
| 2002/0140070 A1 | 10/2002 | Sook Lim |
| 2002/0175383 A1 | 11/2002 | Kocon et al. |
| 2003/0011005 A1 | 1/2003 | Joshi |
| 2003/0011054 A1 | 1/2003 | Jeun et al. |
| 2003/0042403 A1 | 3/2003 | Joshi |
| 2003/0052408 A1 | 3/2003 | Quinines et al. |
| 2003/0075786 A1 | 4/2003 | Joshi et al. |
| 2003/0085456 A1 | 5/2003 | Lee et al. |
| 2003/0085464 A1 | 5/2003 | Lang |
| 2003/0107126 A1 | 6/2003 | Joshi |
| 2003/0122247 A1 | 7/2003 | Joshi |
| 2003/0139020 A1 | 7/2003 | Estacio |
| 2003/0173659 A1 | 9/2003 | Lee et al. |
| 2004/0041242 A1 | 3/2004 | Joshi |
| 2004/0063240 A1 | 4/2004 | Madrid et al. |
| 2004/0125573 A1 | 7/2004 | Joshi et al. |
| 2004/0137724 A1 | 7/2004 | Joshi et al. |
| 2004/0159939 A1 | 8/2004 | Joshi |
| 2004/0232542 A1 | 11/2004 | Madrid |
| 2005/0056918 A1 | 3/2005 | Jeun et al. |
| 2005/0167848 A1 | 8/2005 | Joshi |
| 2006/0138532 A1 * | 6/2006 | Okamoto et al. ............ 257/328 |
| 2007/0181984 A1 | 8/2007 | Son et al. |
| 2007/0205503 A1 | 9/2007 | Baek et al. |

* cited by examiner

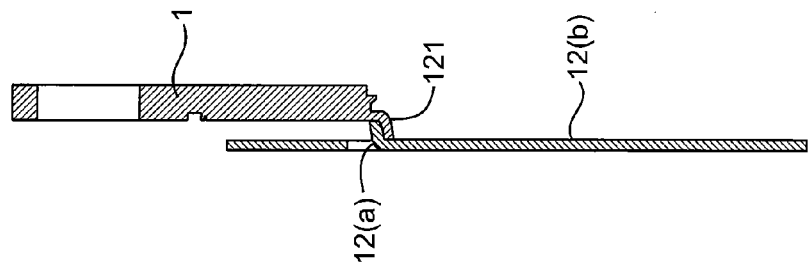
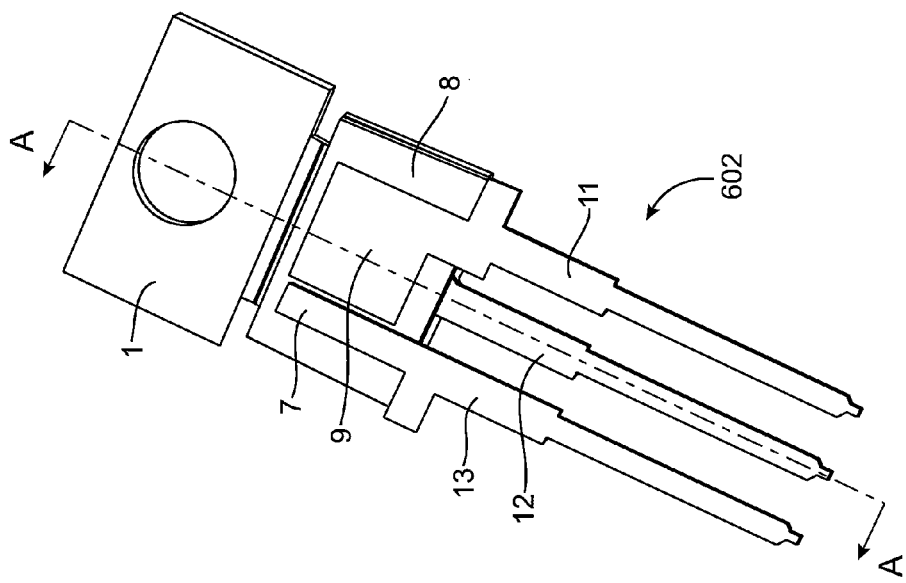

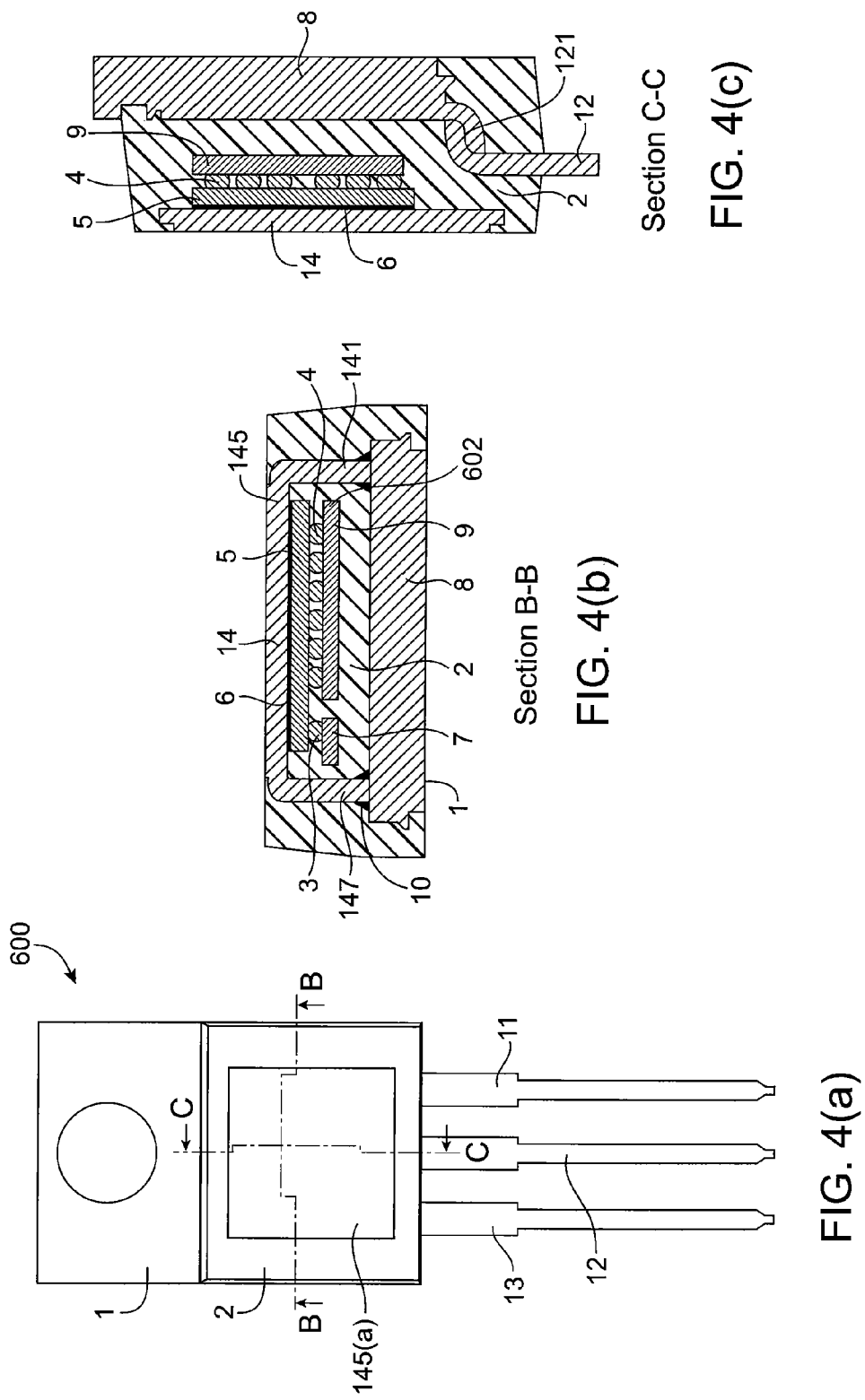

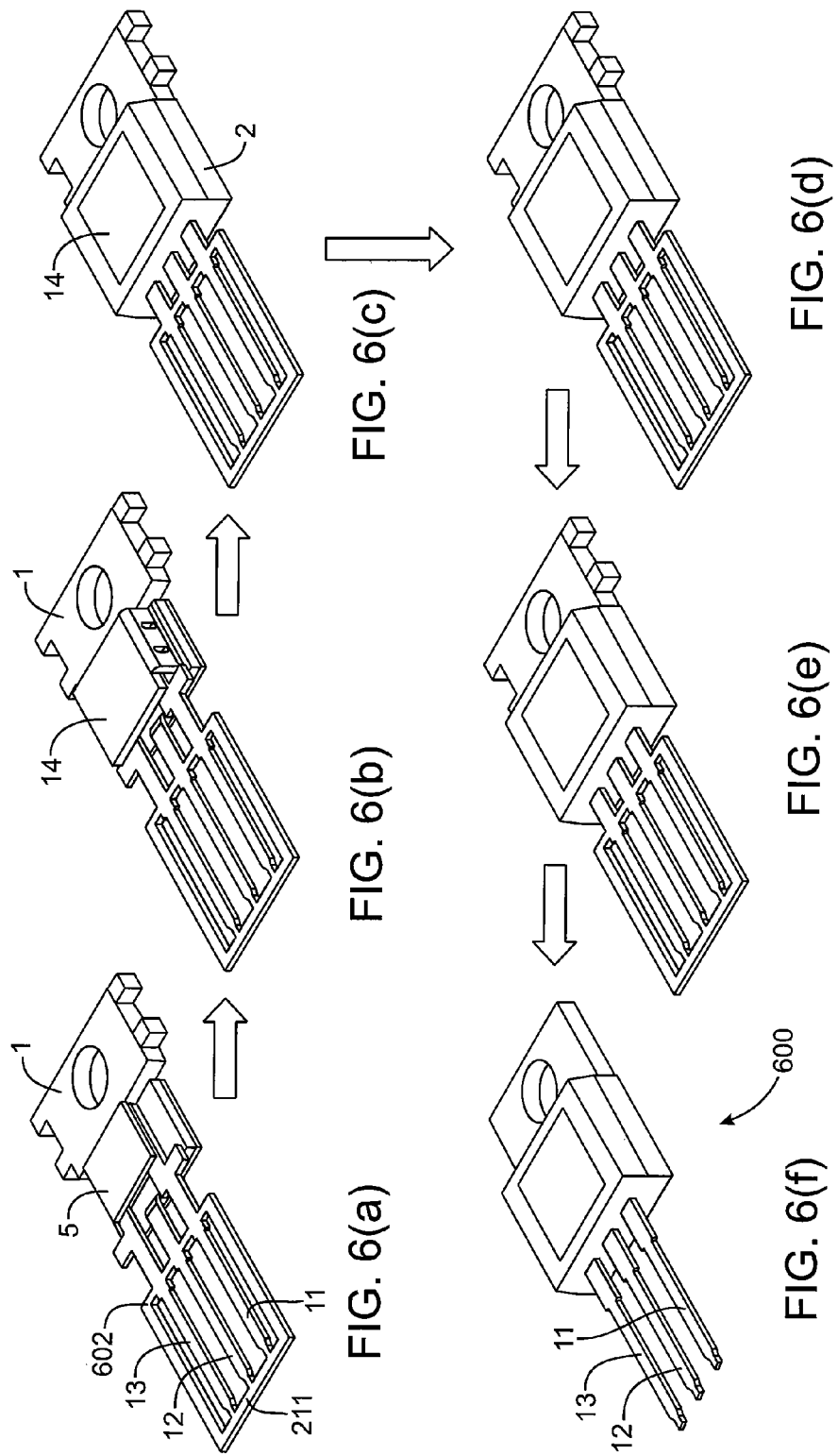

SEMICONDUCTOR DIE PACKAGE INCLUDING HEAT SINKS

CROSS-REFERENCES TO RELATED APPLICATIONS

Not applicable

BACKGROUND

Semiconductor die packages are known in the semiconductor industry, but could be improved. For example, electronic devices such as wireless phones and the like are becoming smaller and smaller. It is desirable to make thinner semiconductor die packages so that they can be incorporated into such electronic devices. It would also be desirable to improve upon the heat dissipation properties of conventional semiconductor die packages. Semiconductor die packages including power transistors, for example, generate a significant amount of heat, and the heat needs to be removed. It would also be desirable to provide end users of such semiconductor die packages with various interconnection options.

Embodiments of the invention address these and other problems, individually and collectively.

BRIEF SUMMARY

Embodiments of the invention are directed to semiconductor die packages, methods for making semiconductor die packages, and assemblies using semiconductor die packages.

One embodiment of the invention is directed to a semiconductor die package comprising a first heat sink, a second heat sink coupled to the first heat sink, and a semiconductor die between the first heat sink and the second heat sink. The semiconductor die is electrically coupled to the first heat sink and the second heat sink. The semiconductor die may also be attached to a lead.

Another embodiment of the invention is directed to a method comprising attaching a semiconductor die to a first heat sink, and attaching the semiconductor die to a second heat sink, wherein the semiconductor die is disposed between the first heat sink and the second heat sink. The semiconductor die may also be attached to a lead.

Other embodiments of the invention are directed to electrical assemblies and systems incorporating the semiconductor die packages.

BRIEF DESCRIPTION OF THE DRAWINGS

FIGS. 2(a)-2(b) respectively show top perspective and side views of portions of a semiconductor die package according to an embodiment of the invention.

FIG. 4(a) shows a top plan view of a semiconductor die package according to an embodiment of the invention.

FIG. 4(b) shows a front cross-sectional view of the semiconductor die package shown in FIG. 4(a) shown along the line B-B.

FIG. 4(c) shows a side cross-sectional view of the semiconductor die package shown in FIG. 4(a) shown along the line C-C.

FIGS. 6(a)-6(f) shows views of portions of a semiconductor die package as it is being formed.

DETAILED DESCRIPTION

A semiconductor die package including at least two heat sinks is disclosed. The semiconductor die package includes a first heat sink, a second heat sink coupled to the first heat sink, and a semiconductor die between the first heat sink and the second heat sink. The semiconductor die is electrically coupled to the first heat sink and the second heat sink. The semiconductor die may also be attached to a lead.

The specific examples of semiconductor die packages that are described below are power MOSFET packages including vertical transistors. It is understood, however, that embodiments of the invention are not limited thereto, and may include other types of semiconductor die packages. The semiconductor dies in the semiconductor die packages preferably have inputs at surfaces of the semiconductor dies, and outputs at opposite surfaces of the semiconductor dies. For example, an alternative semiconductor die package embodiment may comprise a semiconductor die comprising a diode, which has an input at one surface of the die and an output at an opposite surface of the die.

Figure 1:
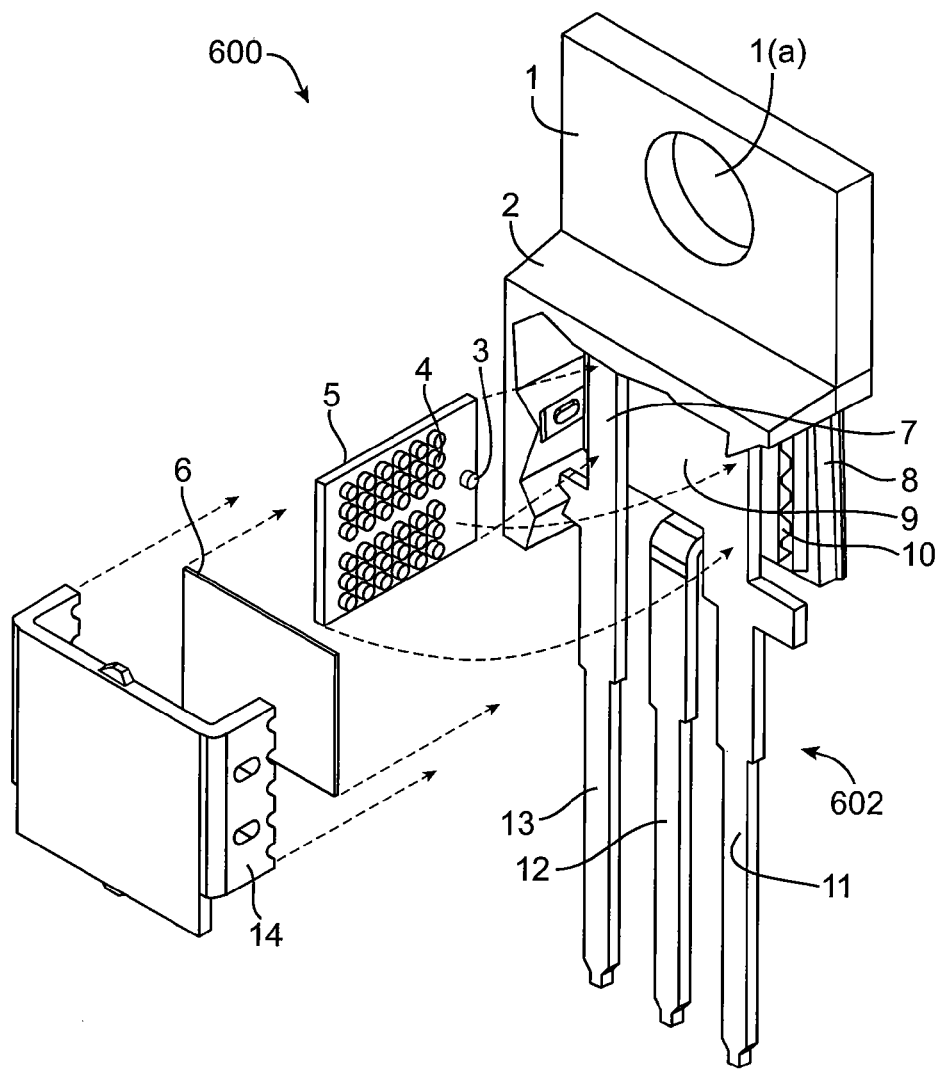
FIG. 1 shows a partially exploded top view of a semiconductor die package according to an embodiment of the invention.

FIG. 1 shows a partially exploded view of a semiconductor die package 600 according to an embodiment of the invention. The semiconductor die package 600 comprises a leadframe 602, and a semiconductor die 5 with conductive bumps 3, 4 mounted on the leadframe 602. Although one semiconductor die is shown in this embodiment, other packages according to other embodiments of the invention may include more than one semiconductor die.

The conductive bumps 3, 4 may include a gate bump 3 and a number of source bumps 4. They may electrically and/or mechanically couple the leadframe 602 to the semiconductor die 5. The bumps 3, 4, may comprise solder (e.g., Pb—Sn and lead free solder), or may comprise conductive stud bumps (e.g., copper stud bumps) or electroless NiAu bumps.

The semiconductor die package 600 may also comprise at least two heat sinks 1, 14, where the semiconductor die 5 in the semiconductor die package 600 is located between the heat sinks 1, 14. A first heat sink 1 comprising a screw hole 1(a) and an attach portion 8 may be coupled (electrically and/or mechanically) to the second heat sink 14 using a first adhesive 10 (e.g., a first conductive adhesive) such as a silver filled epoxy or solder. The second heat sink 14 may also be coupled (electrically and/or mechanically) to the semiconductor die 5 using a second adhesive 6 (e.g., a second conductive adhesive). The second adhesive 6 may be the same or different than the first adhesive 10.

A molding material 2, such as an epoxy molding material, may contact at least a part of the first heat sink 1, the leadframe 602, the semiconductor die 5, and the second heat sink 14. The molding material 2 may comprise any suitable material including a conductive epoxy.

The leadframe 602 may comprise a die attach region comprising a source attach pad 9, and a gate attach pad 7. The leadframe 602 also comprises a number of leads including a source lead terminal 11, a drain lead terminal 12, and a gate lead terminal 13. The source lead terminal 11, the drain lead terminal 12, and the gate lead terminal 13 may all be electrically isolated from each other, and may be respectively coupled to the source region, the drain region, and gate region in a transistor in the semiconductor die 5.

In FIG. 1, the source bumps 4 can electrically and mechanically couple a source region (not shown) in the semiconductor die 5 to the source attach pad 9 and consequently the source lead terminal 11. The gate bump 3 can electrically and mechanically couple a gate region (not shown) in the semiconductor die 5 to the gate attach pad 7 and consequently the gate lead terminal 13. The second heat sink 14 is attached to the attach portion 8 of the first heat sink 1, and consequently to the drain lead terminal 12 using the first adhesive 10. The drain region in the semiconductor die 5 may be at an opposite surface to the surface of the die 5 that has the source and gate regions, and may be coupled to the second heat sink 14. A drain (or other type of output) conduction path may be formed by the first and second heat sinks 1, 14, and the drain lead terminal 12.

Figure 11:
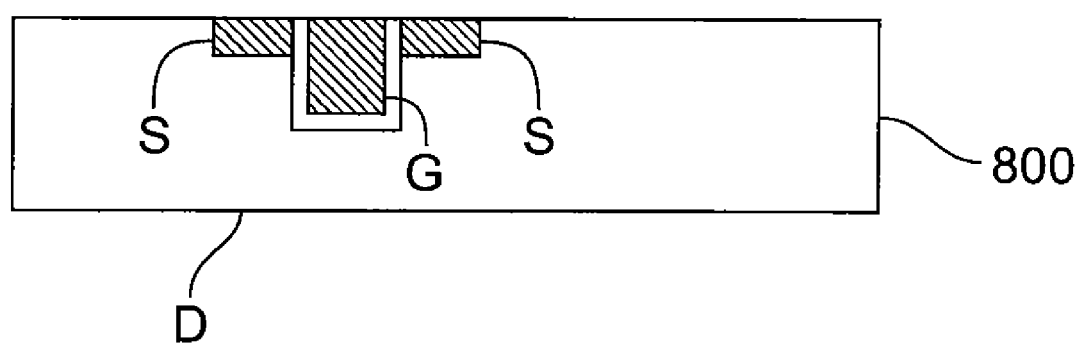
FIG. 11 shows a schematic cross-section of a semiconductor die comprising a vertical MOSFET with a trenched gate.

The semiconductor dies used in the semiconductor packages according to preferred embodiments of the invention include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. A schematic cross-section of a semiconductor die 800 comprising a vertical MOSFET with a trenched gate is shown in FIG. 11. G represents a gate region, D represents a drain region, and S represents a source region in FIG. 11. Other devices that may be present in a semiconductor die may include diodes, BJT (bipolar junction transistors) and other types of electrical devices.

Referring to FIG. 1, the leadframe 602, as well as the first and second heat sinks 1, 14, may be formed of the same or different materials. Suitable materials may include thermally and electrically conductive materials including copper, copper alloys, etc.

FIG. 2(a) is a top perspective view of a portion of the semiconductor die package shown in FIG. 1. FIG. 2(b) is a side, cross-sectional view of the portion of the semiconductor die package shown in FIG. 2(a) along the line A-A. As shown in FIGS. 2(a)-2(b), the drain lead terminal 12 may be electrically and mechanically coupled to the first heat sink 1 via a weld 121. The portion 12(a) of the drain lead terminal 12 that is closer to the first heat sink 1 may be bent downward (as shown in FIG. 2(b)) relative the major portion 12(b) of the drain lead terminal 12, which is substantially planar in this embodiment. In other embodiments, instead of a weld 121, a conductive adhesive could be used to join the drain lead terminal 12 to the first heat sink 1. In some embodiments, the leadframe 602 may be attached to the first heat sink 1 prior to molding or attaching the semiconductor die to the leadframe 602.

Figure 3A:
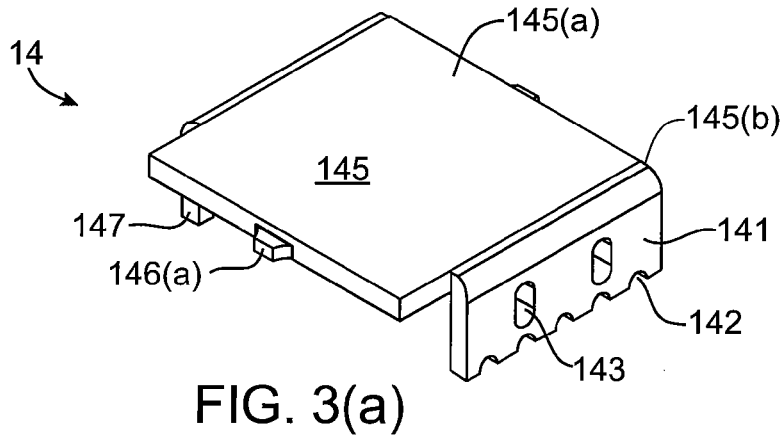
FIGS. 3(a)-3(c) respectively show top perspective, top, and side views of a heat sink according to an embodiment of the invention.
Figure 3B:
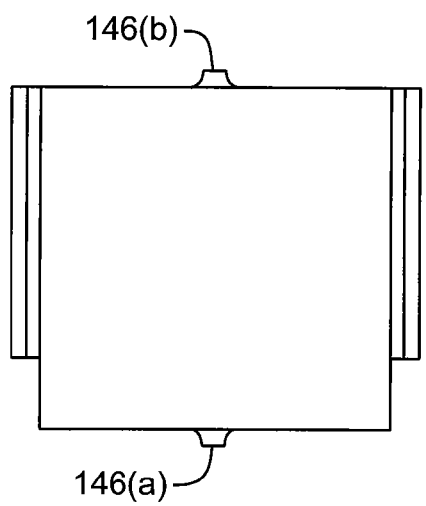
Figure 3C:
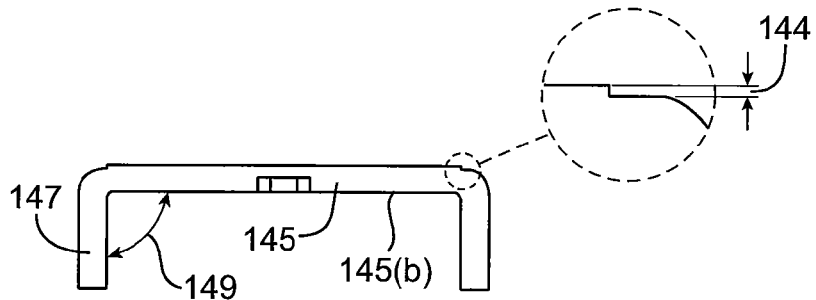

FIGS. 3(a)-3(c) respectively show top perspective, top, and side views of a second heat sink according to an embodiment of the invention. Although a specific heat sink configuration is shown in FIGS. 3(a)-3(c), other embodiments may have heat sinks with other configurations.

FIG. 3(a) shows a second heat sink 14 comprising a top, planar portion 145, which can include a top surface 145(a). The top portion 145 with the top surface 145(a) may from an external electrical and/or thermal connection for the semiconductor die package. The second heat sink 14 may also comprise two side portions 141, 147, which may be substantially perpendicular to the top portion 145(a), and may be on opposite sides of the top portion 145(a). A bend 145(b) is present between side portion 141 and top portion 145(a). Although two side portions 141, 147 are shown in FIG. 3(a), other heat sinks according to other embodiments of the invention may have more or less side portions. As illustrated by side portion 141, each side portion 141, 147 may comprise a number of apertures 143 (e.g., slots) which pass through it. The apertures 143 may be used to allow a molding material to lock to the first heat sink 1. The heat sink 1 may also comprise a number of grooves 142 at terminal ends of the side portions 141, 147. The grooves 142 may provide for a better electrical connection between the described first heat sink 1 (see FIG. 1) and the second heat sink 14 by providing for a larger surface area for solder attachment.

As shown in FIGS. 3(a) and 3(b), a number of tie bars 146(a), 146(b) may also be on opposite sides of the second heat sink 145(a). The tie bars 146(a), 146(b) may connect the second head sink 14 to other heat sinks in an array during the semiconductor die package manufacturing process.

As shown in FIG. 3(c), an angle 149 formed by the side portion 147 and the top portion 145 may be about 90 degrees. This allows the side portion 147 to connect to the previously described first heat sink 1. FIG. 3(c) also shows a step 144 formed at the edges of the top portion 145 to avoid mold flashes. It can also be used as a mold locking feature. Molding material may fill the step, but need not cover the top surface 145(a) of the first heat sink 1.

FIG. 4(a) shows a top view of a semiconductor die package 600 according to an embodiment of the invention. FIG. 4(b) shows a front cross-sectional view of the semiconductor die package shown in FIG. 4(a) shown along the line B-B. FIG. 4(c) shows a side cross-sectional view of the semiconductor die package shown in FIG. 4(a) shown along the line C-C.

As shown in FIG. 4(b), the source pad 9 and the gate pad 7 of the leadframe 602 are spaced from the attach portion 8 of the first heat sink 1 and second heat sink 14 (including its top portion 145 and side portions 141, 147 as shown in FIG. 3(a)). The semiconductor die 5 is spaced from the side portions 141, 147, and the attach portion 8 of the second heat sink 14, and is present between the first and second heat sinks 1, 14. The first conductive adhesive 10 attaches terminal ends of the second heat sink 14 to the attach portion 8 of the first heat sink 8.

FIG. 4(c) shows a cross-sectional view along the line C-C in FIG. 4(a). In FIG. 4(c), the weld 12 connecting the drain lead terminal 12 to the first heat sink 1 is more clearly shown in FIG. 4(c).

As shown in both FIGS. 4(b) and 4(c), the molding material 2 has external surfaces that are substantially coplanar with the exterior surfaces of the first heat sink 1 (e.g., the bottom surface in FIG. 4(b)) and the second heat sink 14 (e.g., the top surface in FIG. 4(b). The exposed heat sink surfaces can provide better heat dissipation from the die 5 and can allow external heat dissipation structures (e.g., an additional heat sink structure, a circuit board, etc.) to be attached to the heat sink surfaces to provide for even better heat dissipation. Also, because the molding material 2 does not cover all surfaces of the first and second heat sinks 1, 14, the semiconductor die package 600 is thin.

Figure 5B:
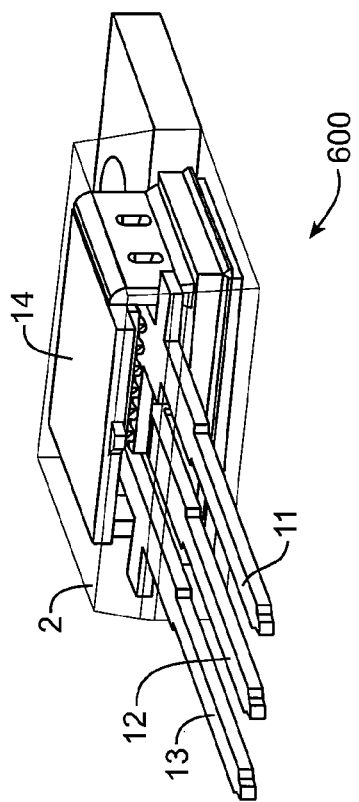
FIGS. 5(a)-5(b) show perspective views of semiconductor die packages.
Figure 5A:
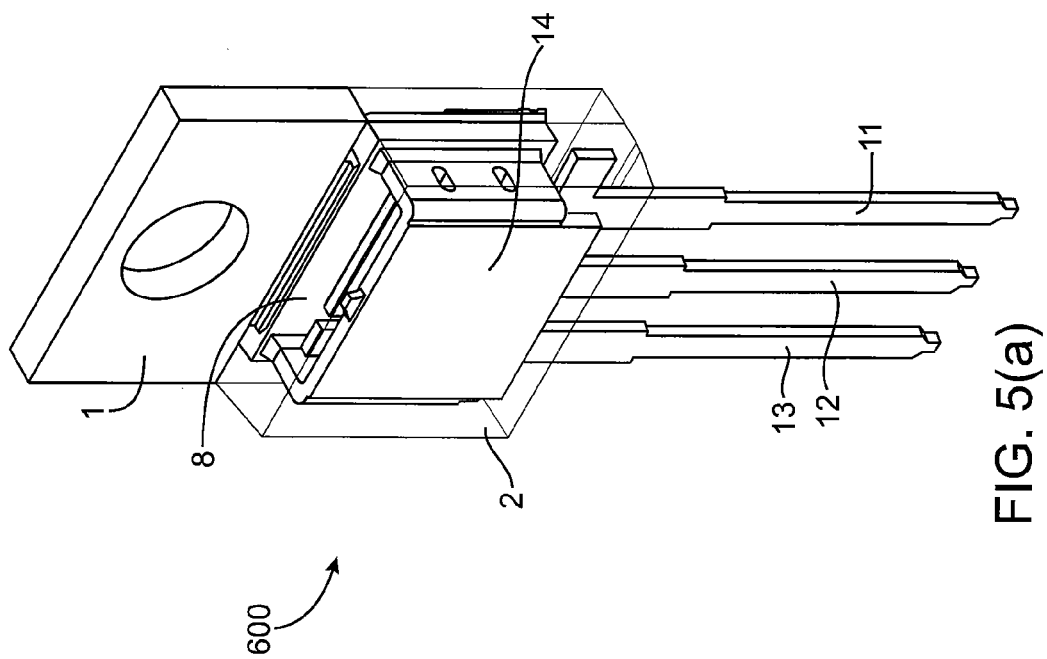

FIGS. 5(a)-5(b) show perspective views of semiconductor die packages. The elements in FIGS. 5(a)-5(b) are described above.

Another embodiment of the invention is directed to a method comprising attaching a semiconductor die to a first heat sink, and attaching the semiconductor die to the second heat sink. The semiconductor die is disposed between the first heat sink and the second heat sink in the semiconductor die package. FIGS. 6(a)-6(f) shows views of portions of a semiconductor die package as it is being formed in a more detailed process. Some process details have been described above, and the descriptions of such processing steps are described herein.

FIG. 6(a) shows a semiconductor die 5 being attached to the first heat sink 1. In some embodiments, prior to attaching the die 5 to the first heat sink 1, the first heat sink 1 may have been previously attached to the leadframe 602. The leadframe 602 may include a frame 211, which surrounds the lead terminals 11, 12, 13, prior to the final formation of the semiconductor die package. The frame 211 may eventually be removed.

FIG. 6(b) shows the attachment of the second heat sink 14 to the first heat sink 1. They may be coupled together using solder or some other suitable conductive adhesive. The conductive adhesive may then be cured if appropriate. Suitable curing process conditions are known, to those of skill in the art.

FIG. 6(c) shows molding a molding material 2 around at least a portion of the leadframe 602, the semiconductor die 5, and the first and second heat sinks 1, 14. To prevent the top surface of the second heat sink 14 and the bottom surface of the first heat sink 1 from being coated with molding material, the top and bottom surfaces may each be covered with tape or a surface of a molding die in a molding tool. Suitable molding process conditions are known to those of skill in the art.

FIG. 6(d) shows a deflashing process, whereby excess molding material may be removed from the leads in the leadframe 602.

FIG. 6(e) and FIG. 6(f) respectively show plating (electroless or electroplating), and then singulation and test of the semiconductor die package 600. In some embodiments, the terminal leads 11, 12, 13, may be plated with a material that is compatible with solder.

Figure 7B:
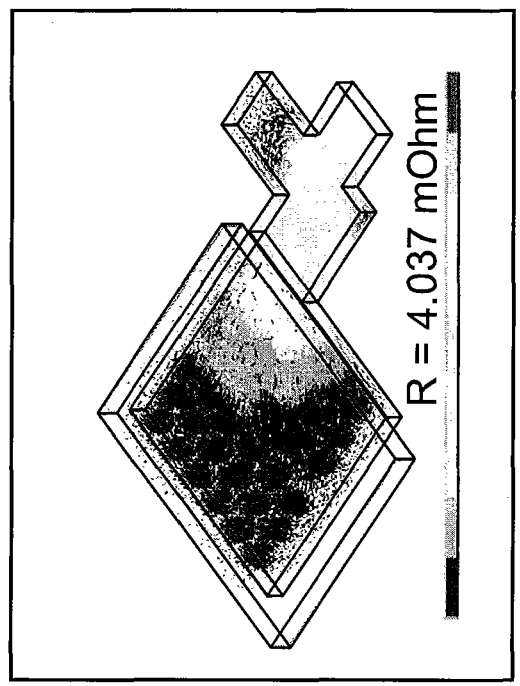
FIG. 7(b) shows FEA analysis data for heat sinks that can be used in embodiments of the invention.
Figure 7A:
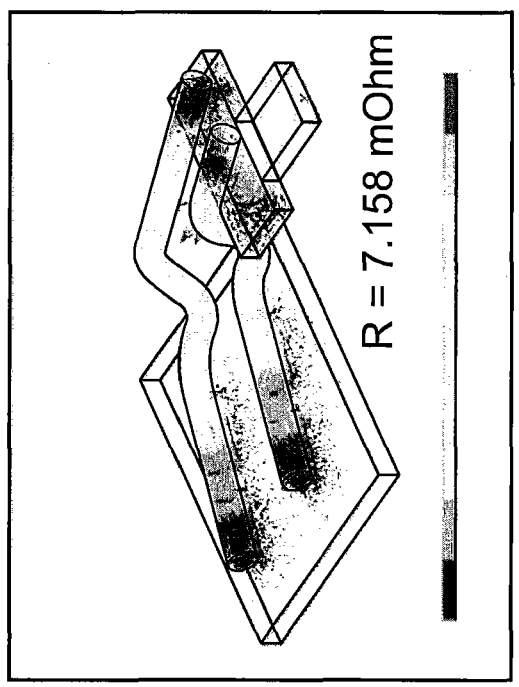
FIG. 7(a) shows FEA analysis data for wirebonds in a semiconductor die package.

FIG. 7(a) shows FEA analysis data for wirebonds. FIG. 7(b) shows FEA analysis data for heat sinks used in embodiments of the invention. As shown in FIGS. 7(a) and 7(b), electrical resistance FEA simulation results show that embodiments of the invention can have an electrical resistance reduction (about 43%) as compared to a semiconductor die package comprising aluminum wire bonds.

Figure 8:
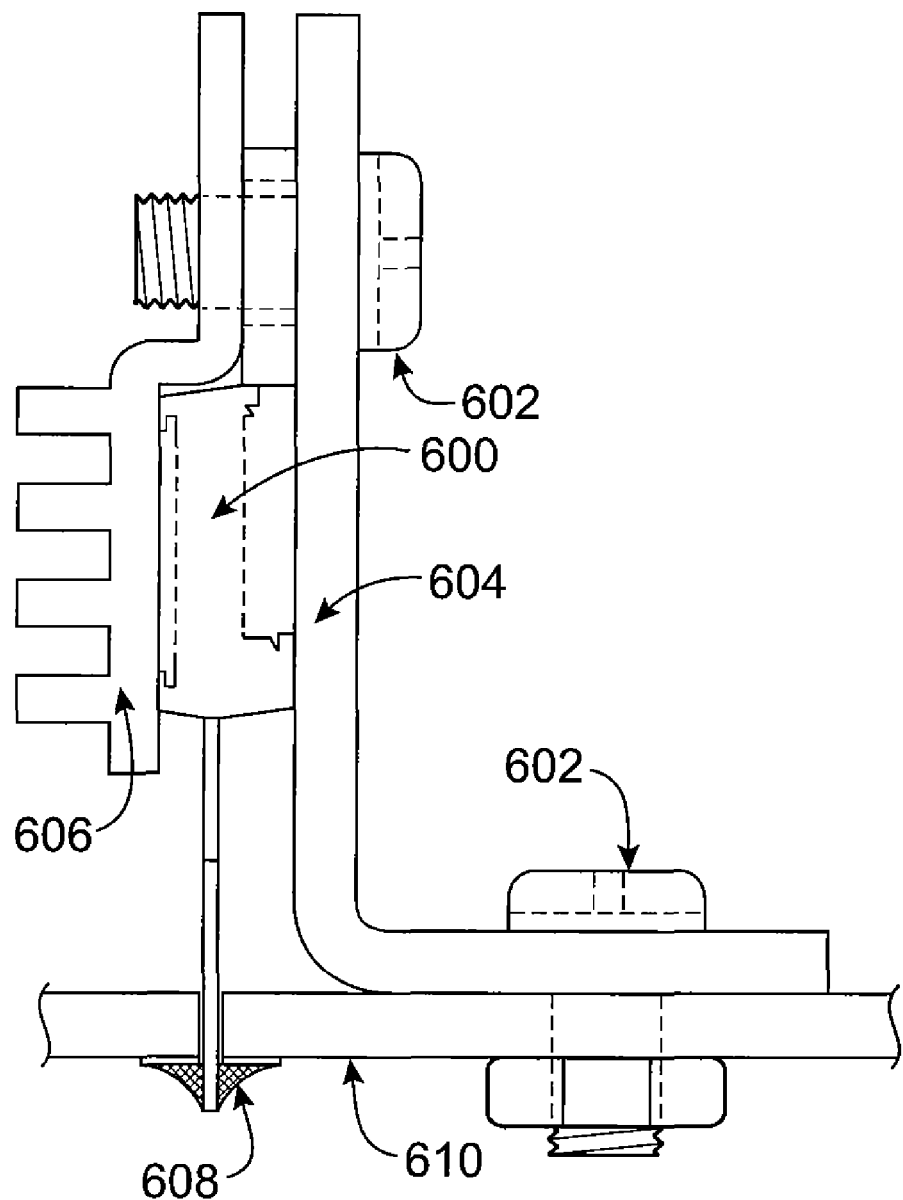
FIG. 8 shows a side view of an assembly embodiment of the invention.

FIG. 8 shows a side view of an assembly according to an embodiment of the invention. FIG. 8 shows an assembly comprising a semiconductor die package 600 sandwiched between a front heat dissipation structure 606 and a back heat dissipation structure 604. The front heat dissipation structure may comprise fins to help dissipate heat. Screws 602 join the heat dissipation structures 606, 604 together, and also join the back heat dissipation structure 604 to a printed circuit board 610. The leads in the semiconductor die package 600 may also be connected to the printed circuit board (PCB) 610 via a solder joint 608. The leads may provide for gate and source connections to the package 600 as described above. The screws 602 may provide for a drain connection, if desired, or may provide for a thermal connection to the semiconductor die package 600. As shown, the semiconductor die package 600 is oriented perpendicular to the orientation of the printed circuit board 610.

As shown by FIG. 8, embodiments of the invention can have an exposed upper heat sink in addition to existing bottom heat sink that also has an exposed surface. End users may choose to attach additional heat dissipation structures to the semiconductor die packages according to embodiments of the invention if they wish.

Figure 9:
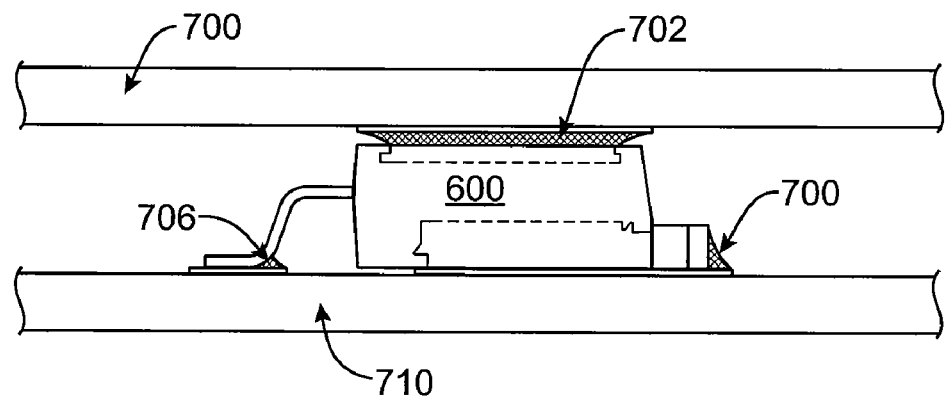
FIGS. 9-10 shows side views of other assembly embodiments including dual PCB applications.
Figure 10:
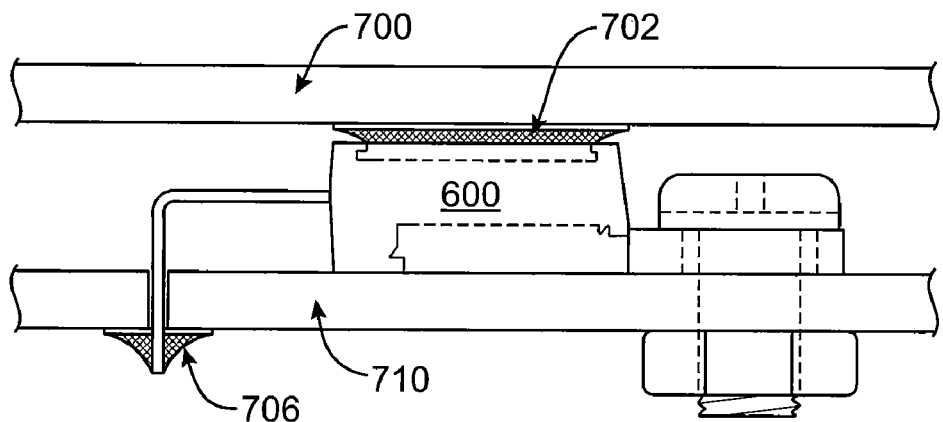

FIGS. 9-10 shows side views of assemblies including dual PCB applications. FIG. 9 shows a TO-263 type dual heat sink configuration, and FIG. 10 shows a TO-220 dual heat sink configuration.

As shown in FIGS. 9-10, the semiconductor die package 600 may be sandwiched between a first PCB 700 and a second PCB 710. Solder joints 702, 710 may electrically couple to drain connections in the package 600. Solder joint 706 may electrically couple to a source and a gate connection in the package 600 to the PCB 710. The PCBs 700, 710 may serve as heat dissipation structures, and they may also provide for electrical connections to the drain in the semiconductor die in the semiconductor die package 600 via its top and bottom surfaces, as well as to the source and gate in the semiconductor die via the die package's lead terminals.

Embodiments of the invention may include a number of unique and advantageous features. For example, embodiments of the invention may employ an exposed top heat sink, which is electrically connected to the exposed bottom heat sink in the semiconductor die package. As illustrated above, embodiments of the invention are thin and can dissipate heat effectively. Second, embodiments of the invention may expose top and bottom heat sinks, and a semiconductor die may be located between the first and second heat sinks. This allows for better heat transfer than conventional semiconductor die packages. Third, in embodiments of the invention, a leadframe including gate and source attach pads may be located over and spaced from a bottom heat sink. The bottom heat sink may be pre-welded to a drain lead terminal in the leadframe. Alternatively, the drain lead terminal may be connected to the bottom heat sink using a conductive solder epoxy. Fourth, in some embodiments, the top heat sink clip may comprise side portions and slots on the side portions. Such features allow for better mold locking and attachment between first and second heat sinks.

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

Moreover, one or more features of one or more embodiments of the invention may be combined with one or more features of other embodiments of the invention without departing from the scope of the invention. Also, unless indicated to the contrary, the steps in the methods described herein may take place in any suitable order without departing from the scope of the invention.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A semiconductor die package comprising:
a first heat sink;
a second heat sink coupled to the first heat sink;
a drain lead; and
a semiconductor die comprising a first surface comprising a source region and a second surface opposite to the first surface comprising a drain region coupled to the drain lead and being between the first heat sink and the second heat sink,
wherein the drain region of the semiconductor die is electrically coupled to the first heat sink, the drain lead, and the second heat sink.

2. The semiconductor die package of claim 1 wherein the semiconductor die comprises a power MOSFET and a gate region at the first surface.

3. The semiconductor die package of claim 2 further comprising a gate lead coupled to the gate region.

4. The semiconductor die package of claim 1 further comprising a source lead coupled to the source region.

5. The semiconductor die package of claim 1 wherein the second heat sink comprises at least a first side portion and a second side portion and a planar portion substantially perpendicular to the first side portion and the second side portion, and wherein the first side portion and the second side portion are mechanically and electrically coupled to the first heat sink.

6. The semiconductor die package of claim 5 wherein the first and second side portions comprise apertures.

7. The semiconductor die package of claim 1 further comprising a molding material covering at least a portion the semiconductor die, the first heat sink, and the second heat sink.

8. The semiconductor die package of claim 1 further comprising a molding material covering at least a portion of the semiconductor die, the first heat sink, and the second heat sink, wherein the molding material exposes planar surfaces of the first and second heat sinks, and wherein exterior surfaces of the molding material are substantially coplanar with the planar surfaces of the first and second heat sinks.

9. The semiconductor die package of claim 1 wherein the first and second heat sinks comprise copper.

10. An assembly comprising:
the semiconductor die package of claim 1;
a first heat dissipation structure in thermal communication with the first heat sink; and
a second heat dissipation structure in thermal communication with the second heat sink.

11. An assembly comprising:
the semiconductor die package of claim 1;
a first circuit board attached to the first heat sink; and
a second circuit board attached to the second heat sink.

12. A system comprising the semiconductor die package of claim 1.

13. The semiconductor die package of claim 1 further comprising a molding material covering at least a portion of the semiconductor die.

14. The semiconductor die package of claim 13 wherein the first and second heat sinks comprise copper.

* * * * *